(12) United States Patent
Wenham et al.

(10) Patent No.: US 6,210,991 B1
(45) Date of Patent: Apr. 3, 2001

(54) METAL CONTACT SCHEME USING SELECTIVE SILICON GROWTH

(75) Inventors: Stuart Ross Wenham, Menai Heights; Martin Andrew Green, Waverley, both of (AU)

(73) Assignee: Unisearch Limited, New South Wales (AU)

( * ) Notice: Subject to any disclaimer, the term of this patent is extended or adjusted under 35 U.S.C. 154(b) by 0 days.

(21) Appl. No.: 09/403,411
(22) PCT Filed: Apr. 23, 1998
(86) PCT No.: PCT/AU98/00293
 § 371 Date: Dec. 17, 1999
 § 102(e) Date: Dec. 17, 1999
(87) PCT Pub. No.: WO98/48462
 PCT Pub. Date: Oct. 29, 1998

(30) Foreign Application Priority Data

Apr. 23, 1997 (AU) ................................... PO 6389

(51) Int. Cl.$^7$ .................................................. H01L 21/322
(52) U.S. Cl. ................................ 438/97; 438/96; 438/98; 438/166; 438/149; 136/246; 136/244; 136/249
(58) Field of Search .................................. 438/96, 97, 98, 438/166, 149; 136/246, 244, 249, 258 PC

(56) References Cited

U.S. PATENT DOCUMENTS

| | | |
|---|---|---|
| 3,413,157 | 11/1968 | Kuiper . |
| 4,012,235 | 3/1977 | Mayer et al. . |
| 4,239,810 | 12/1980 | Alameddine et al. . |
| 4,313,768 | 2/1982 | Sanders et al. . |
| 4,604,791 * | 8/1986 | Todorof ................................. 29/581 |
| 4,624,045 | 11/1986 | Ishihara et al. . |
| 4,633,031 * | 12/1986 | Todorof ................................. 136/249 |
| 4,781,766 | 11/1988 | Barnett et al. . |
| 4,836,861 * | 6/1989 | Pelzer et al. ........................... 136/246 |
| 4,910,153 * | 3/1990 | Dickson .................................. 437/4 |
| 5,879,977 * | 3/1999 | Zhang et al. ........................... 438/166 |
| 6,111,191 * | 8/2000 | Hall et al. ........................ 136/258 PC |

FOREIGN PATENT DOCUMENTS

32309/89 10/1989 (AU) .
61-69178 4/1986 (JP) .

OTHER PUBLICATIONS

"Buried–contact Silicon Solar Cells" by Stuart Wenham—Progress in Photovoltaics: Research and Applications, vol. 1, 3–10 (1993).

* cited by examiner

Primary Examiner—Matthew Smith
Assistant Examiner—Victor V. Yevsikov
(74) Attorney, Agent, or Firm—Jordan and Hamburg LLP

(57) ABSTRACT

The method is provided for contact formation in semiconductor devices. The method involves forming an insulating layer over an active region to be contacted to, forming holes or openings in the insulating layer to expose the active region and forming an aluminium layer over the insulating layer. A source of non-crystalline semiconductor material or damaged crystalline material is located in contact with the aluminium layer such that the non-crystalline or damaged crystalline material is dissolved in the aluminium layer and redeposited on the surface of the semiconductor material to be contacted to. The semiconductor material is deposited by solid phase epitaxial growth and carries with it, aluminium atoms which leave the semiconductor material as heavily doped p-type material.

29 Claims, 5 Drawing Sheets

METAL CONTACT SCHEME USING SELECTIVE SILICON GROWTH

INTRODUCTION

The present invention relates generally to the field of photovoltaic devices and in particular the invention provides a new method of forming contacts to such devices.

BACKGROUND OF THE INVENTION

There has been an ongoing tendency in the Photovoltaic Industry, to continually reduce silicon substrate thicknesses. Improved techniques, such as the introduction of wire sawing has had a big impact in terms of producing thinner substrates with smaller kerf losses. However, back contact formation presents some problems with thinner substrates with the effective rear surface recombination velocity (RSRV) becoming of relative greater importance. Few, if any, current commercial techniques have good enough rear surface passivation (low enough RSRV) to prevent performance loss with thinner devices.

One alternative approach which has been considered from time to time over the past decade, is to use simple abrasion of the rear surface to expose the pyramid peaks of the rear surface texturing, therefore potentially facilitating contact to the underlying p-type material. Some of these ideas were published in the mid 1980's (Wenham, PhD thesis, The University of New South Wales, 1986, P171), although a suitable technology/processing sequence for the implementation of the ideas, has not previously been identified. One of the main reasons for this is linked to the preference for using a rear n-type layer for both simplicity (since it can be simultaneously formed with the front n-type layer) and performance enhancement (via a lower effective RSRV). However, problems occur when trying to penetrate through the n-type layer to the p-type underlying material via a boron diffusion. Furthermore, the high temperatures associated with boron diffusion can often damage or degrade commercial substrates.

Silicon has a very high mobility in aluminium, even at temperatures well below the aluminium/silicon eutectic temperature of 577° C. It has been known for some time that amorphous silicon can penetrate through an aluminium layer and epitaxially grow or deposit onto a crystalline silicon surface on the opposite side of the aluminium, at temperatures well below the eutectic temperature (Majni and Ottavian; Applied Physics letters, Vol 51., No. 2, Jul. 15, 1977 pp 125–126). This effect is evident whether the crystalline silicon is mono-crystalline or poly-crystalline. The same end results are achieved in the event that the positions of the aluminium and amorphous silicon layers are reversed with the silicon again initially penetrating into the aluminium when heated prior to epitaxially growing on the newly exposed crystalline silicon surface. Similar results have also been observed for germanium.

Based on this rather extraordinary mechanism for solid phase epitaxial growth at low temperature, a new contacting scheme for crystalline devices is proposed whereby the above growth approach is used to enable p-type contacts to be made to the substrate.

This approach is particularly useful for forming p-type contacts through a rear n-type floating junction, the benefits of which are often destroyed by other low cost contacting methods, which usually short out the floating junction. The presently proposed method enables p-type contacts to be made to the substrate while simultaneously forming a rectifying junction to the rear n-type layer, thereby leaving the n-type layer isolated. The rear contact area can be restricted to about 1% of the rear surface with the remainder being well passivated by the rear floating junction in conjunction with a high quality thermal oxide or independently deposited dielectric. The low temperatures involved in this process are particularly attractive for wafers grown by the Czochralski technique with the corresponding well passivated rear surface being particularly well suited for thin Czochralski wafers in commercial production.

SUMMARY OF THE INVENTION

According to a first aspect, the present invention provides a method of forming a small area contact on a semiconductor device while simultaneously isolating a high recombination velocity metal/semiconductor interface from active regions of the device via a grown or deposited heavily doped layer, the method including the steps of:
  i) forming a thin aluminium layer over a dielectric coated semiconductor material to be contacted to, where at least small regions of the semiconductor material are exposed to the aluminium through gaps or holes or openings in the dielectric layer;
  ii) depositing amorphous semiconductor material over the aluminium layer;
  iii) heating the device to a temperature below the eutectic temperature of the semiconductor material with aluminium during the deposition of amorphous semiconductor material or after the amorphous material is deposited, whereby semiconductor material migrates through the aluminium layer to form a crystalline layer on the surface underlying the aluminium layer, the formed layer being doped $p^+$ by aluminium atoms from the aluminium layer.

According to a second aspect, the present invention provides a method of forming a small area contact on a semiconductor device while simultaneously isolating a high recombination velocity metal/semiconductor interface from active regions of the device via a grown or deposited heavily doped layer, the method including the steps of:
  i) forming a thin amorphous layer of like semiconductor material over a dielectric coated semiconductor material to be contacted to, where at least small regions of the semiconductor material are exposed to the amorphous layer through gaps, holes or openings in the dielectric layer;
  ii) forming a thin aluminium layer over the amorphous layer;
  iii) heating the device to a temperature below the eutectic temperature of the semiconductor material with aluminium, whereby semiconductor material migrates from the amorphous layer into the aluminium layer from where it forms a crystalline layer on the exposed surface of the underlying crystalline material by solid phase crystal growth, the formed layer being doped $p^+$ by aluminium atoms from the aluminium layer.

According to a third aspect, the present invention provides a method of forming a small area contact on a semiconductor device while simultaneously isolating a high recombination velocity metal/semiconductor interface from active regions of the device via a grown or deposited heavily doped layer, the method including the steps of:
  i) making small openings in a dielectric layer of a dielectric coated semiconductor material and damaging the crystal structure of the crystalline material underlying the dielectric layer;
  ii) forming a thin aluminium layer over the damaged crystalline material; and iii) heating the device to a temperature below the eutectic temperature of the semiconductor material with aluminium, whereby semiconductor material migrates from the damaged region into the aluminium layer where it remains in solution until the underlying crystalline material is exposed at which time the silicon in solution forms a crystalline layer on the surface of the underlying crystalline material by solid phase crystal growth, the formed layer being doped p$^+$ by aluminium atoms from the aluminium layer.

In one advantageous form of the invention, the device includes a p-type layer or region which is being contacted to, and an n-type layer or region over the surface of the p-type layer or region and the contact is formed by opening holes in the n-type layer or region and then forming the contact as described above. Preferably, the n-type layer or region has an insulating layer over its surface and the holes are opened through both the insulating layer and the underlying n-type layer or region. Preferably, the insulating layer is an oxide layer being an oxide of the semiconductor material and preferably, the semiconductor material is silicon although the method is also suitable for use with other semiconductors such as germanium and germanium/silicon alloys.

In one embodiment, the surface over which the contact is being formed is textured and the opening of the n-type layer or region and the insulating layer is by removing the tops of peaks in the textured surface.

In the case of silicon semiconductor devices, the aluminium layer is preferably between 5000 Å & 7000 Å thick and the amorphous layer is in the range of 4000 Å to 7000 Å, although thicker layers of aluminium can be used if required, such as for lateral conductivity, and thicker amorphous or microcrystalline silicon layers can also be used if required, such as for better isolation between the high recombination velocity at the metal interface and the active silicon material. Thinner silicon layers can also be used to improve the rear reflector of the device, limited in principle only by the crystallised layer being too thin to prevent shunting of the floating junction. The heating step is performed at a temperature in the range of 350° C. to 577° C. and preferably in a range from 450° C. to 530° C.

The invention is applicable to both thin film and bulk devices, but is most beneficial when diffusion lengths are greater than the device thickness.

BRIEF DESCRIPTION OF THE DRAWINGS

Embodiments of the invention will now be described by way of example with reference to the accompanying drawings in which.

DETAILED DESCRIPTION OF THE EMBODIMENTS

The present invention relies on a property of silicon that, even at temperatures below its eutectic with aluminium (577° C.), it has a very high diffusion coefficient in aluminium enabling relatively large amounts of the silicon to be drawn into the aluminium. This process will occur preferentially, with amorphous silicon and not crystalline silicon, since the atoms, originating from the amorphous silicon and passing through the aluminium, will only re-arrange themselves to minimise the energy associated with the bonding arrangement. Therefore the process is unidirectional. Amorphous silicon with its high degree of disorder represents a high energy state, which is then lowered through the process of the silicon penetrating into the aluminium. Crystalline silicon however, has an even lower free energy so that the silicon that is effectively dissolved in the aluminium, will contribute to the growth of the crystalline silicon by being deposited out from the aluminium/ silicon layer by solid phase epitaxial growth. In regions where the semiconductor is coated by the dielectric, solid phase epitaxial growth can take place by either lateral diffusion of the silicon in the aluminium to the contact regions or, following crystal nucleation either at the dielectric surface or ultimately within the aluminium if it becomes supersaturated. In general, nucleation of crystals on the dielectric surface leads to the formation of a p-type polysilicon layer sandwiched between the dielectric layer and the aluminium.

Figure 1:
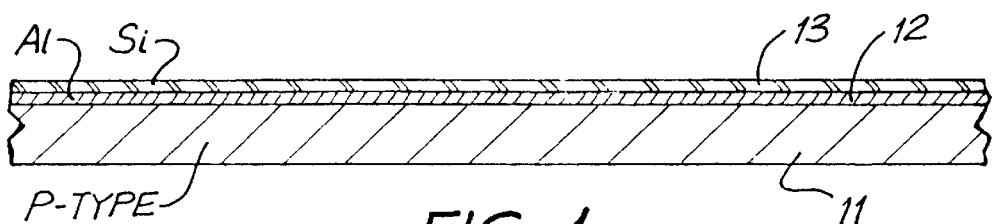
FIG. 1 diagrammatically illustrates a cross section of a p-type substrate with an aluminium layer and an amorphous silicon layer as a precursor to the formation of a contact on the p-type layer.
Figure 2:
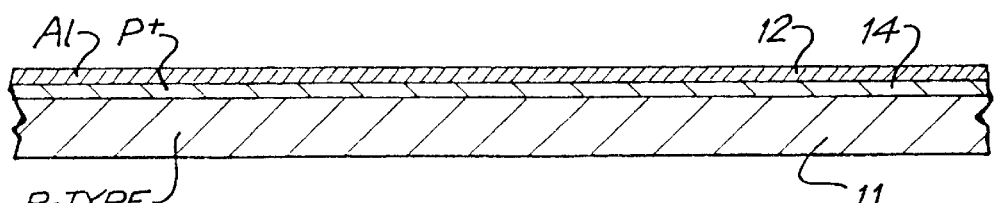
FIG. 2 shows the substrate of FIG. 1 after migration of the silicon in the amorphous layer to form a p$^+$ layer under the aluminium layer.

The method of the invention is most simply explained with reference to FIGS. 1 and 2, in which FIG. 1 shows a p-type substrate 11 with an overlying aluminium layer 12 and an amorphous silicon layer 13 and is a precursor to the formation of the contact by the method of the present invention and FIG. 2 shows the same structure after the amorphous silicon layer 13 has migrated through the aluminium layer 12 to form a polycrystalline silicon layer 14. During the migration of the silicon through the aluminium layer 12, aluminium ions are picked up and carried into the polycrystalline layer 14, with a concentration of active aluminium deposits in the vacinity of its solid solubility in crystalline silicon at that temperature, thereby forming a p$^+$ (back surface field) layer on the surface of the p-type substrate 11. By using the method of the present invention, a high quality crystalline or polycrystalline layer is formed on the surface of the p-type substrate having good contact characteristics and providing an excellent interface between the aluminium layer 12 and the underlying p-type substrate 11.

Figure 3:
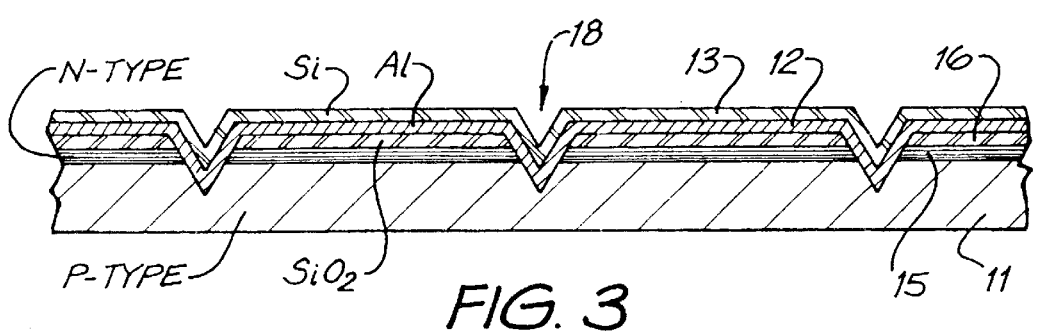
FIG. 3 shows a p-type layer with an n-type layer on its surface and a high quality oxide layer over the n-type layer with abrasions formed in the surface of the substrate and passing through the n-type and oxide layers and a metal layer and an amorphous silicon layer over the top of the oxide layer and passing into the abrasions formed in the surface of the substrate.
Figure 4:
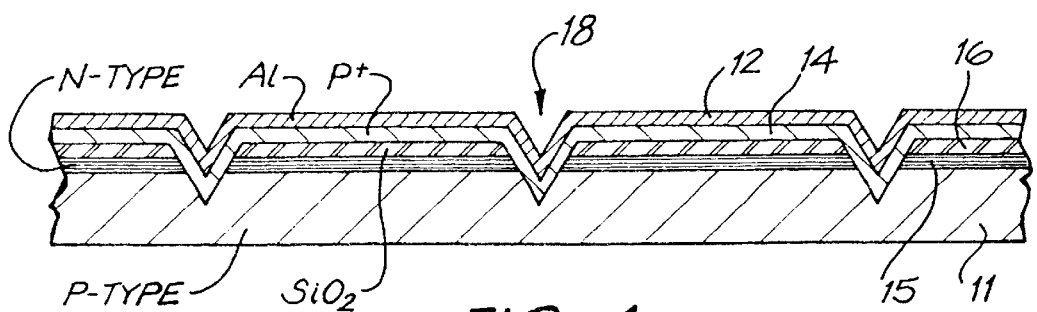
FIG. 4 shows the substrate of FIG. 3 after the process of the present invention when the silicon layer has migrated through the aluminium layer to provide a p$^+$ layer interfacing between the p-type substrate and the aluminium layer in the abraded regions.

Turning to FIGS. 3 and 4, the method described above can be used advantageously in structures having a floating n-type region on their surface. In FIG. 3, the p-type substrate 11 has an overlying n-type region 15 with a high quality silicon oxide layer 16 on its surface. In order to form a contact with the p-type layer, first a number of breaks are made through the n-type and dielectric layers by techniques such as abrasion, forming grooves or holes or scratches 18 or laser ablation etc. The aluminium layer 12 is then deposited over the surface and extends into the grooves, holes or scratches 18 and an amorphous silicon layer 13 is deposited over the aluminium layer 12. After migration of the amorphous silicon layer 13 through the aluminium layer 12, a polysilicon layer 14 is formed over the surface of the oxide layer 16 and within the scratches 18 extending down to contact with the p-type layer 11 as illustrated in FIG. 4. In this structure, the $p^+$ crystalline silicon layer 14 makes contact with the p-type layer 11 providing an interface between the p-type layer 11 and the aluminium layer 12 and forms a rectifying junction with the n-type layer 15 thereby maintaining the isolation of the n-type layer and allowing it to perform a passivation roll.

Figure 5:
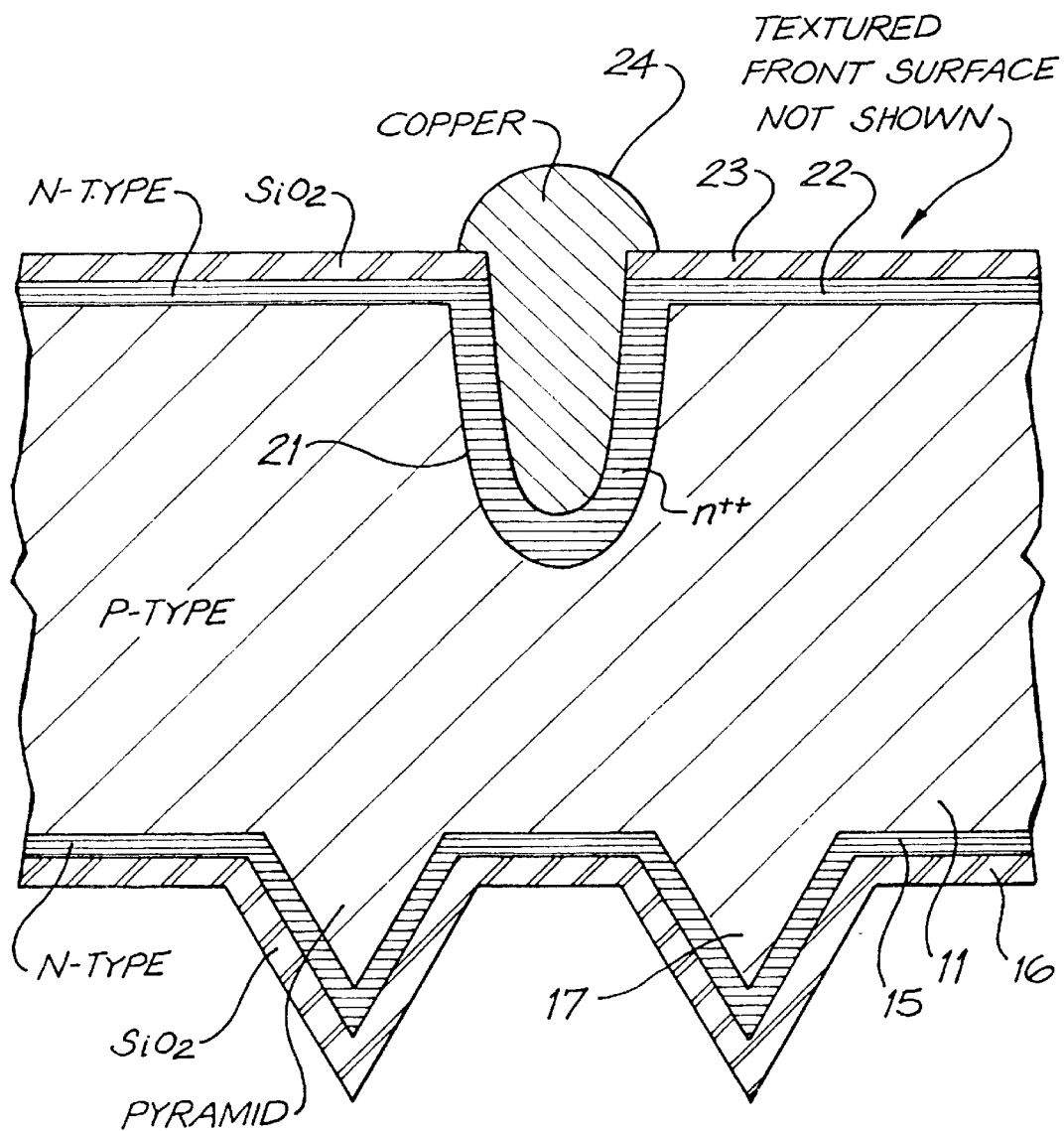
FIG. 5 shows a partly fabricated grooved solar cell with a textured rear surface prior to rear contact formation.

The method of the present invention is particularly useful for making rear contacts to silicon solar cells and this method will now be described with reference to FIGS. 5, 6 and 7. In FIG. 5, a buried contact solar cell is illustrated having a p-type substrate 11 with an n-type surface layer 22 forming a photovoltaic junction. The n-type layer 22 extends into grooves 21 in the surface of the cell and these grooves are filled with copper 24 to form a buried contact to the n-type region. Other than in the grooves, the n-type layer 22 is covered by a high quality silicon oxide layer 23 and the front surface of the cell would typically also be textured although, for simplicity this is not shown in FIGS. 5, 6 and 7.

Figure 6:
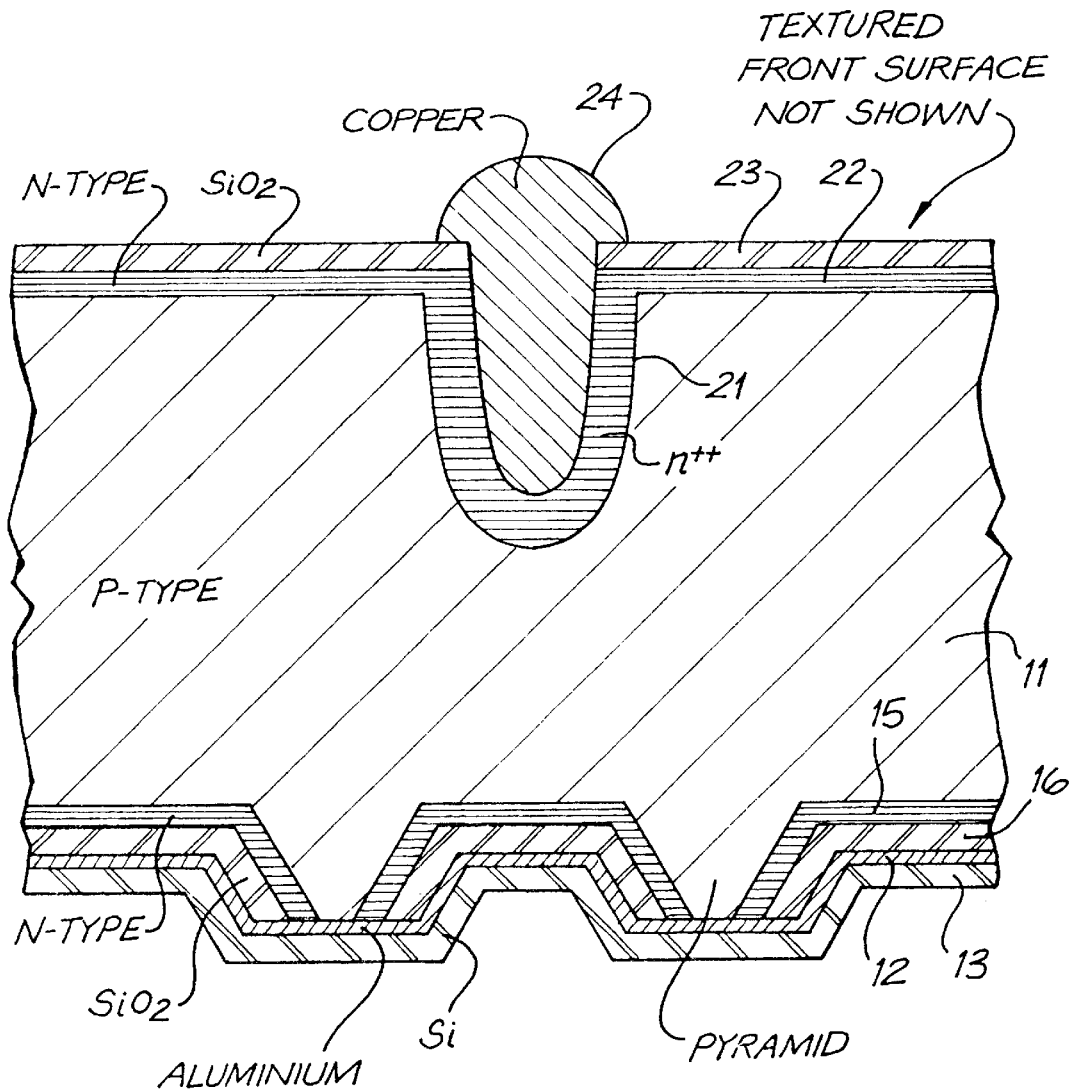
FIG. 6 shows the solar cell of FIG. 5 after the tips of the pyramids forming the rear texturing have been removed and an aluminium layer and an amorphous silicon layer have been deposited over the rear surface.
Figure 7:
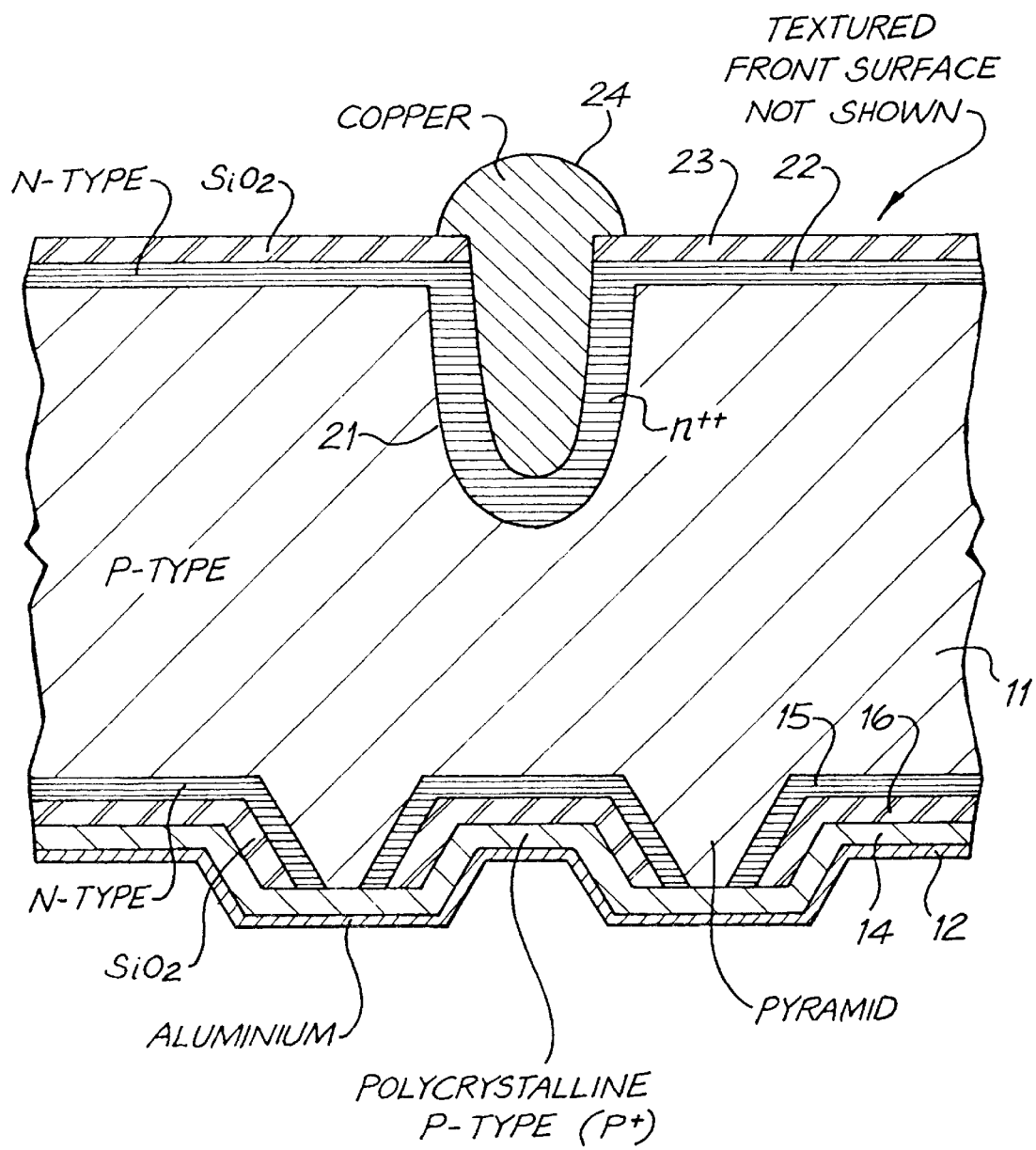
FIG. 7 shows the cell of FIG. 6 after migration of the silicon through the aluminium layer to contact with the underlying p-type region thereby contacting the rear aluminium layer to the bulk p-type layer of the cell.

The back surface of the cell of FIGS. 5, 6 and 7 is also textured and the texturing is shown in an exaggerated form in FIGS. 5, 6 and 7, for clarity. In FIG. 5, the cell is shown prior to the formation of rear contacts and with the pyramids of the rear surface texturing still intact. In FIG. 5 it will be seen that the rear surface of the cell is provided with a rear floating junction formed between the p-type bulk region 11 and an n-type rear surface layer 15 with a high quality oxide layer 16 formed over the n-type layer and surface texturing taking the form of pyramid 17.

Turning to FIG. 6, after the tips of the pyramids 17 have been removed by a suitable technique such as abrasion, an aluminium layer 12 is formed over the rear surface and an amorphous silicon layer 13 is formed over the aluminium layer as a precursor to the formation of the rear contact. Referring to FIG. 7, after migration of the silicon through the aluminium layer 12, a high quality polysilicon layer 14 is formed between the aluminium layer 12 and the high quality oxide layer 16. In the regions of the tips of the pyramids, where the oxide layer 16 and the underlying n-type layer 15 have been interrupted, the $p^+$ polysilicon layer 14, is directly in contact with the underlying p-type substrate 11 and forms an interface between the aluminium layer 12 and the underlying p-type substrate, while forming a rectifying junction between the $p^+$ layer 14 and the n-type layer 15 of the floating rear junction.

One of the preferred embodiments involves depositing a thin layer of amorphous silicon onto the rear surface of the thin oxidised Czochralski textured wafer that has already had the peaks of the pyramids exposed and an aluminium layer formed in the above manner. Sputtering provides a potentially low cost approach for forming thin silicon layers of this type, although a range of approaches could be used, such as E-beam evaporation, plasma enhanced CVD, hot wire CVD, thermal co-evaporation of aluminium containing a small amount of silicon etc.. The same layer forming process can also be used for the underlying aluminium layer deposition. A low temperature sinter would then enable the amorphous silicon via the aluminium layer, to participate in solid phase epitaxial growth of $p^+$ silicon onto the exposed regions at the pyramid peaks. This process will automatically leave the aluminium at the surface as shown in FIG. 7, in preparation for subsequent processing or metal contacting such as nickel and/or copper plating to enable a p-type contact to be made to the substrate while simultaneously forming a rectifying junction to the rear n-type layer. The rear contact area is preferably restricted to only about 1% of the rear surface with the remainder being well passivated by a rear floating junction in conjunction with a high quality thermal oxide or alternative dielectric such as silicon oxide. A cross section of the final structure is shown in FIG. 7, with the p-type polycrystalline layer thickness being kept sufficiently small to minimise light absorption so as to allow the rear aluminium layer to act as an effective rear surface reflector. Using this approach, it is anticipated that solar cell energy conversion efficiencies of 20% will be achieved in commercial production using Czochralski wafers of only 150–200 microns thickness. The primary advantages of the approach of the preferred embodiment are as follows:

1. The growth of the $p^+$ layer doped with aluminium at its solid solubility, provides a very good quality back surface field while forming a good junction with the adjacent phosphorus diffused rear surface.

2. This process facilitates the use of a p-type substrate entirely enshrouded by well passivated n-type, surfaces except for the very small contact area occurring at the peaks of the pyramids on the rear surface. This is consistent with the achievement of a 20% efficient Czochralski solar cell with close to 100% internal quantum efficiencies for all wavelengths of light, and correspondingly high voltages resulting from the reduced bulk volume.

3. The rear surface processing can all be conducted at temperatures in the vicinity of 400° C., which appears to be important for Czochralski substrates.

4. From the perspective of light trapping, the presence of a thin silicon layer across the rear surface sandwiched between the rear oxide and the aluminium layer should cause little problems with light absorption with the overall structure giving excellent reflectivity. By appropriate choice of the silicon film/oxide layer thicknesses, it is feasible to achieve virtually 100% reflection (with the presence of aluminium) for light of wavelength 1.1 microns.

Figure 8:
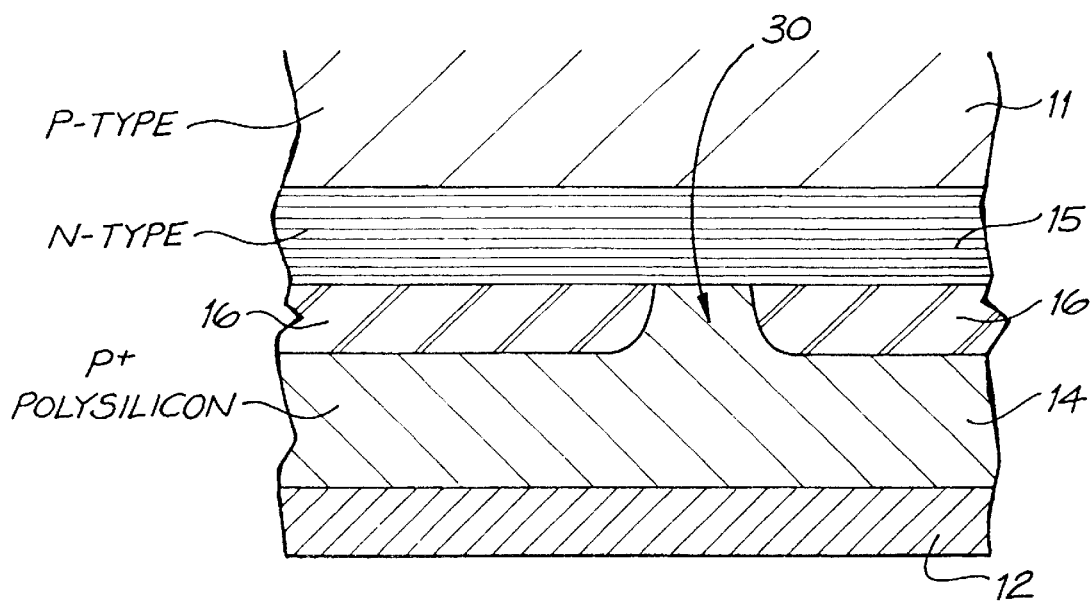
FIG. 8 shows in detail, a pinhole in the back oxide layer of the cell of FIG. 7.

5. In regions away from the pyramid peaks, $p^+$ polycrystalline silicon will still be deposited onto the oxide from the aluminium/silicon layer. This will have the added benefit, that, as illustrated in FIG. 8, any pin holes 30 through the oxide 16 to the floating n-type layer 15, will be isolated from the aluminium metal contact 12 by the pn junction formed through the pinhole 30 by this polysilicon 14 with the n-type layer 15.

6. Due to the similarities in temperatures, it is feasible to sinter the nickel for the front grooves at the same time as carrying out the solid phase epitaxial growth.

7. Contact resistance can be a problem with the boron diffused surfaces in conjunction with nickel plating. The approach overcomes any such contact resistance problems.

With regard to removing the pyramid peaks, this-tends to happen automatically in screen printed processes when the cells travel along metal conveyer belts. Some prior art processes used ceramic beads to deliberately displace the wafer from the metal belt to minimise this damage. Considerable effort is used with the development of belt furnaces for screen printed devices, to minimise the vibration and corresponding damage to wafer surfaces. It would be quite easy to develop a low cost commercial process for applying abrasion to the textured wafer to remove the pyramid peaks. Considerable flexibility can also be achieved via the density (and hence size) of the pyramids. Pyramid sizes from submicron dimensions to in excess of 50 microns can be formed as required, by control of the texturing conditions and chemicals. Another important issue is the flatness of the surface to avoid excessively large separation between abraded pyramids. This used to be of considerable concern with older sawing techniques, but does not appear to be a problem with wafers cut by wire sawing.

It is also feasible to vary the order of deposition such as to deposit the amorphous (or micro crystalline) silicon before the aluminium. The amorphous silicon still penetrates into the aluminium prior to crystallising onto the exposed crystalline silicon surface. If the amorphous silicon is so thick that the crystalline silicon surface is not exposed when the aluminium is saturated with silicon, then crystallisation takes place in the bulk of the aluminium allowing more amorphous silicon to penetrate into the aluminium. Eventually, the crystalline silicon surface is exposed (provided the aluminium source is not depleted) allowing solid phase epitaxial growth to proceed, but with polysilicon material separating this material from the aluminium at the surface.

Another alternative is to use a silicon source (ie, e-beam source or sputtering target or thermal evaporation source), where an aluminium source is used which already has a small percentage of silicon within the aluminium. This may avoid the necessity for separate deposition processes.

A further alternative is to provide an alternative source for the silicon, namely originating from the original p-type silicon substrate, if the silicon at the exposed surface is treated (such as by laser melting/ablating/damaging or appropriate mechanical abrasion or chemical treatment) so as to sufficiently raise the free energy of the exposed silicon at the surface, then the heavily defected/damaged silicon will preferentially penetrate into the aluminium (without any additional source of silicon) and solid phase epitaxially regrow off the newly exposed crystalline silicon surface that has had all its highly defected and damaged material removed.

It will be appreciated by one skilled in the art that a range of metals and alloys can potentially be used as a replacement for the aluminium while still providing the high mobility and solubility for the silicon (or alternative semiconductor material) to facilitate the realisation of the contacting scheme. Additional control of the doping type and concentration in the region of crystal growth can be provided via the presence of dopants in the deposited amorphous silicon and/or appropriate selection of metal/metal alloy.

Simple methods for forming the dielectric coating on the rear surface of devices according to the invention include:
using the diffusion oxide automatically formed during the rear n-type diffusion; or
allowing the anti reflection coating for the front surface to simultaneously coat the rear surface.

Figure 9:
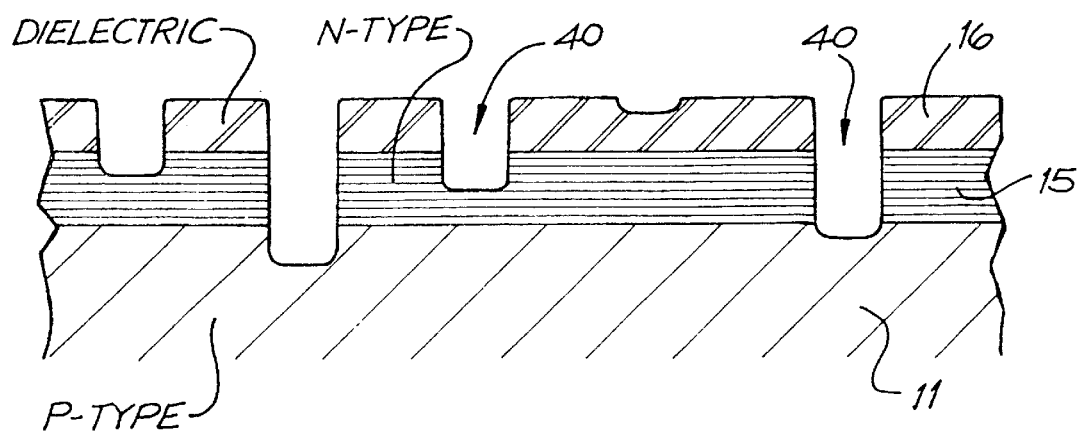
FIG. 9 diagrammatically illustrates a method of using pinholes in the back oxide layer to form rear contacts using a method according to the present invention.

This invention is also applicable to devices formed on multicrystalline silicon substrates, and while, these cannot be textured in the same way as monocrystalline silicon, there are various chemical etches and/or mechanically abrasive approaches that can lead to a rough surface finish for the pre-processed wafer. Such a rough surface can then be abraded (as with the textured surface) to expose the p-type layer. Alternatively, the flat initial surface could be retained and then following the dielectric deposition, appropriately mechanically abraded (such as by sand blasting or scratching or sandpaper, or mechanically scribed such as with a dicing wheel saw etc), or optically processed to open gaps in the dielectric and/or n-type layer (such as laser scribing), or chemically treated to create random openings in the dielectric. The latter has considerable appeal since dielectric layers 16 often have random pinholes (for example as illustrated in FIG. 9), particularly if deposited by PECVD where dust particles settle during deposition leading to pinholes in the dielectric when chemically treated, such as in NaOH, or KOH, or HF followed by KOH, etc. Pinholes 40 in many dielectrics can be formed as chemical etches (acid or alkaline) attack weaknesses in the dielectric layer 16. Having formed pinholes 40, a silicon etch (such as $HNO_3$ with a small amount of HF, or KOH or NaOH etc) can be used to etch through the n-type material 15, to the p-type material 11, leaving a structure such as that illustrated in FIG. 9, after which the methods according to the invention provide a simple, self aligned approach to form a good quality contact to those regions.

With some silicon deposition approaches (such as PECVD, sputtering, e-beam etc), it is possible to simultaneously heat the silicon substrate. In this case, it is possible to deposit the aluminium first and then heat the substrate (say to 400° C.) while depositing the silicon which allows it to penetrate directly into the aluminium and therefore grow off the exposed crystalline silicon region while the deposition continues. Contacting schemes according to the present invention, can also be used with other technologies such as screen printed top surfaces.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a small area contact on a semiconductor device while simultaneously isolating a high recombination velocity metal/semiconductor interface from active regions of the device via a grown or deposited heavily doped layer, the method including the steps of:
   i) forming a thin aluminium layer over a dielectric coated semiconductor material to be contacted to, where at least small regions of the semiconductor material are exposed to the aluminium through gaps or holes or openings in the dielectric layer;
   ii) depositing amorphous semiconductor material over the aluminium layer;
   iii) heating the device to a temperature below the eutectic temperature of the semiconductor material with aluminium during the deposition of amorphous semiconductor material or after the amorphous material is deposited, whereby semiconductor material migrates through the aluminium layer to form a crystalline layer on the surface underlying the aluminium layer, the formed layer being doped $p^+$ by aluminium atoms from the aluminium layer.

2. The method as claimed in claim 1, including forming a p-type layer or region which is to be contacted to, forming an n-type layer or region over the surface of the p-type layer or region and forming the contact with the p-type layer or region by opening holes in the n-type layer or region and then forming the contact through the n-type layer.

3. The method of claim 2, wherein the insulating layer is formed over the n-type layer or region and the holes are opened through both the insulating layer and the underlying n-type layer or region.

4. The method as claimed in any one of the preceding claims, wherein the insulating layer is an oxide layer.

5. The method of claim 4, wherein the oxide layer is an oxide of the semiconductor material.

6. The method as claimed in any one of claims 1, 2 or 3 wherein the surface over which the contact is being formed is textured and the opening of the n-type layer or region and the insulating layer is performed by removing tops of peaks in the textured surface after formation of the respective layers.

7. The method as claimed in any one of claims 1, 2 or 3, wherein the semiconductor material is silicon.

8. The method of claim 7, wherein the aluminium layer is in the range of 5000 Å to 7000 Å thick, and the amorphous layer is in the range of 4000 Å to 7000 Å.

9. The method as claimed in claim 7, wherein the heating step is performed at a temperature in the range of 350° C. to 577° C. and preferably in a range from 450° C. to 530° C.

10. The method as claimed in any one of claims 1, 2 or 3, wherein the semiconductor material is germanium.

11. The method as claimed in any one of claims 1, 2, or 3 wherein the semiconductor material is a germanium/silicon alloy.

12. The method as claimed in any one of claims 1, 2 or 3 wherein the semiconductor device is a thin film photovoltaic device.

13. The method of claim 12, wherein minority carrier diffusion lengths in active regions of the device are greater than the device thickness.

14. The method as claimed in any one of claims 1, 2 or 3 wherein the semiconductor is a bulk photovoltaic device.

15. A method of forming a small area contact on a semiconductor device while simultaneously isolating a high recombination velocity metal/semiconductor interface from active regions of the device via a grown or deposited heavily doped layer, the method including the steps of:
 i) forming a thin amorphous layer of like semiconductor material over a dielectric coated semiconductor material to be contacted to, where at least small regions of the semiconductor material are exposed to the amorphous layer through gaps, holes or openings in the dielectric layer;
 ii) forming a thin aluminium layer over the amorphous layer;
 iii) heating the device to a temperature below the eutectic temperature of the semiconductor material with aluminium, whereby semiconductor material migrates from the amorphous layer into the aluminium layer from where it forms a crystalline layer on the exposed surface of the underlying crystalline material by solid phase crystal growth, the formed layer being doped $p^+$ by aluminium atoms from the aluminium layer.

16. A method of forming a small area contact on a semiconductor device while simultaneously isolating a high recombination velocity metal/semiconductor interface from active regions of the device via a grown or deposited heavily doped layer, the method including the steps of:
 i) making small openings in a dielectric layer of a dielectric coated semiconductor material and damaging the crystal structure of the crystalline material underlying the dielectric layer;
 ii) forming a thin aluminium layer over the damaged crystalline material; and
 iii) heating the device to a temperature below the eutectic temperature of the semiconductor material with aluminium, whereby semiconductor material migrates from the damaged region into the aluminium layer where it remains in solution until the underlying crystalline material is exposed at which time the silicon in solution forms a crystalline layer on the surface of the underlying crystalline material by solid phase crystal growth, the formed layer being doped $p^+$ by aluminium atoms from the aluminium layer.

17. The method as claimed in claim 15 or 16, including forming a p-type layer or region which is to be contacted to, forming an n-type layer or region over the surface of the p-type layer or region and forming the contact with the p-type layer or region by opening holes in the n-type layer or region and then forming the contact through the n-type layer.

18. The method of claim 17, wherein the insulating layer is formed over the n-type layer or region and the holes are opened through both the insulating layer and the underlying n-type layer or region.

19. The method as claimed in claim 15 or 16, wherein the insulating layer is an oxide layer.

20. The method of claim 15 or 16, wherein the oxide layer is an oxide of the semiconductor material.

21. The method as claimed in claim 15 or 16, wherein the surface over which the contact is being formed is textured and the opening of the n-type layer or region and the insulating layer is performed by removing the tops of peaks in the textured surface after formation of the respective layers.

22. The method as claimed in claims 15 or 16, wherein the semiconductor material is silicon.

23. The method of claim 22, wherein the aluminium layer is in the range of 5000 Å to 7000 Å thick, and the amorphous layer is in the range of 4000 Å to 7000 Å.

24. The method as claimed in claim 22, wherein the heating step is performed at a temperature in the range of 350° C. to 577° C. and preferably in a range from 450° C. to 530° C.

25. The method as claimed in claims 15 or 16, wherein the semiconductor material is germanium.

26. The method as claimed in claims 15 or 16, wherein the semiconductor material is a germanium/silicon alloy.

27. The method as claimed in claims 15 or 16, wherein the semiconductor device is a thin film photovoltaic device.

28. The method of claim 27, wherein minority carrier diffusion lengths in active regions of the device are greater than the device thickness.

29. The method as claimed in claims 15 or 16, wherein the semiconductor is a bulk photovoltaic device.

* * * * *